United States Patent [19]

Chu

[11] Patent Number: 5,175,054

[45] Date of Patent: Dec. 29, 1992

[54] METALLIZED FILM STRUCTURE AND METHOD

[75] Inventor: Shaw-Chang Chu, Cranbury, N.J.

[73] Assignee: Mobil Oil Corporation, Fairfax, Va.

[21] Appl. No.: 789,561

[22] Filed: Nov. 8, 1991

[51] Int. Cl.⁵ .............................................. B32B 15/08
[52] U.S. Cl. ................... 428/461; 264/210.7; 427/404; 428/516
[58] Field of Search ............ 428/457, 461, 516; 427/404; 264/210.7

[56] References Cited

U.S. PATENT DOCUMENTS 4,345,005  8/1982  All et al. ............................. 428/461
4,410,482  10/1983  Subramanian .................. 428/516 X Primary Examiner—Thomas J. Herbert, Jr.
Attorney, Agent, or Firm—A. J. McKillop; C. J. Speciale; J. P. O'Sullivan

[57] ABSTRACT

A metallized film combination of an oriented polymeric substrate layer having on at least one surface thereof a coating of a blend of (a) a vinyl alcohol homopolymer or copolymer and (b) an ionic copolymer of ethylene and an ethylenically unsaturated monocarboxylic acid wherein at least 10% of the carboxylic acid groups are neutralized with an alkali metal ion; and the surface of said layer blend having a metal layer thereon and the method of coating the blend of (a) and (b) on the substrate after it is machine direction oriented, followed by transverse direction orientation and depositing a metal layer on the coating surface.

11 Claims, No Drawings

METALLIZED FILM STRUCTURE AND METHOD

BACKGROUND OF THE INVENTION

This invention relates to a multi-layer film structure having a metallized surface.

The bonding of metals, such as, aluminum, silver, chromium, etc., to plastic films has allowed such films to replace metallic foils in many instances. The flexibility of the films necessitates the formation of a strong metal-plastic bond, and a number of approaches have been developed for providing such bonding.

In U.S. Pat. No. 4,345,005, the disclosure of which is incorporated herein by reference in its entirety, a homopolymer polypropylene core layer is coextruded with an ethylene propylene copolymer. The film is biaxially oriented and the copolymer layer is corona discharge treated. Thereafter, a metal coating is deposited onto the corona discharge treated layer by any suitable process, such as, vacuum deposition. In order to enhance adhesion between the metal and plastic film, neither the core layer or outer layer(s) contain a slip agent in an amount which would deleteriously affect the metal/polymer bond. The resulting product has utility in flexible packaging. Polypropylene films employed for packaging purposes inherently permit the transmission of oxygen and water vapor from the outside of the film to the inside of packages made up of the films. Oxygen and water vapor promote rapid deterioration of foods packaged in such a container, therefore, their exclusion or control is desired.

It is an object of the present invention to present a metallized film and a method of forming the same which has a decreased oxygen transmission and water vapor transmission rate.

SUMMARY OF THE INVENTION

In accordance with the present invention, a metallized film combination comprises an oriented polymer substrate layer, which in its unmodified form is susceptible of transmitting oxygen and moisture, at least one surface of which having a coating of a blend of (a) a vinyl alcohol homopolymer or copolymer and (b) an ionic copolymer of ethylene and an ethylenically unsaturated monocarboxylic acid wherein at least 10% of the carboxylic acid groups are neutralized with an alkali metal ion; and the surface of said layer blend having a metal layer thereon.

The invention is also concerned with a method of forming a metallized film combination comprising: (a) machine direction orienting a film substrate which is susceptible of transmitting oxygen and moisture, (b) applying to the MD oriented film a blend of a polyvinyl alcohol homopolymer or copolymer and an ionic copolymer of ethylene and an ethylenically unsaturated monocarboxylic acid wherein at least 10% of the carboxylic acid groups are neutralized with an alkali metal ion; (c) stretching the film in the transverse (TD) direction; and (d) depositing on the surface of the blend a metal layer. Before the blend is applied to the MD oriented film it is preferred to corona discharge treat the substrate surface for improved surface wettability. In addition, after the coated film has been biaxially oriented it is preferred to corona discharge treat the coated surface preparatory to applying the metal to the surface.

DESCRIPTION OF PREFERRED EMBODIMENTS

The substrates contemplated herein include any polymeric film substrate which inherently permits the transmission of oxygen and water vapor and wherein the utility of such film would call for a minimization of such transmission. In most cases, the source of oxygen and water vapor referred to herein is atmospheric oxygen and water vapor. While nylon, polyethylene terephthalate, polycarbonate, etc. films are contemplated herein, the particularly preferred class of films are the polyolefins. Within the polyolefin class, homopolymers and copolymers of propylene are preferred. Particularly preferred are isotatic polypropylenes containing at least 80% by weight of isotatic polypropylene. The preferred base substrate layer can be a homopolypropylene having a melting point range of from about 321° to about 336° F. A commercially available material of this description is Exxon 4252 o Fina 3378. Copolymers of propylene with another alpha olefin, preferably ethylene can also be employed.

The vinyl alcohol polymers employed herein can be any commercially available material, for example, Vinol 125, 99.3+% super hydrolyzed polyvinyl alcohol, or Vinol 325, 98% hydrolyzed polyvinyl alcohol obtained from Air Products Inc. The vinyl alcohol polymers include ethylene/vinyl alcohol copolymers obtained from any commercial source, for example, ethylene-vinyl alcohol copolymer (EVOH) is available under the name EVAL from Kura Ray Company, Ltd. of Japan. This material contains about 80% of vinyl alcohol.

The ionomer resin to be blended with the vinyl alcohol polymer may be characterized as a metal-containing ionic copolymer obtained by the reaction between ethylene or an alpha-olefin and an ethylenically unsaturated monocarboxylic acid such as acrylic acid or methacrylic acid wherein at least 10% of said carboxylic acid groups are neutralized by an alkali metal ion. In preparing these copolymers, the ethylene ranges from about 80-99 mol % with the unsaturated monocarboxylic acid ranging from about 1-20% and more preferably from about 1-10 mol %. The base copolymers are converted to ionic copolymers by reaction with an ionizable alkali metal compound, e.g., a sodium or zinc base. This reaction or neutralization is sufficient to at least neutralize 10% of the acid groups. A typical example of preparing an ionic copolymer comprises milling approximately a 500 gram sample of an ethylene-methacrylic acid copolymer containing about 10 mole % by weight of methacrylic acid and then adding thereto about 24 grams of sodium methoxide, dissolved in about 100 mls. of methanol. The sodium methoxide is added to the copolymer over a period of about 5 minutes and the copolymer is worked on the mill. Blending of the composition is continued for approximately 15 minutes, during which time the initial soft, fluid-melt becomes stiff and rubbery. A commercially available alkali salt of ethylene-methacrylic acid copolymer in the form of an aqueous dispersion is Petaflex 56220 obtained from Whittaker Chemical Co.

The blend of (a) and (b) supra comprises about 10-90% by dry weight of the vinyl alcohol homopolymer or copolymer and about 90-10% by dry weight of the ionomer.

The blend of (a) and (b) supra may be further modified by additives and/or modifiers such as wax emulsions, colloidal silica dispersions, antiblocking agents, defoamers, and crosslinkers.

As indicated above, to obtain good adhesion between the metal film and the surface of the blend of the present invention, it is preferred to subject the surface to a corona discharge treatment. This is a conventional treatment and is carried out in a known manner to a value of about 36-60 dynes/cm and preferably 40-50 dynes/cm.

The metal coating can be applied to the corona-treated blend-layer by any known method, such as, sputtering, vacuum deposition or electroplating. Vacuum deposition is a preferred method. The most frequently used coating metal is aluminum, although other metals such as gold, silver, chrome and copper are also contemplated.

In order to effectively inhibit the amount of oxygen transmitted through the base layer, the base layer must be coated with a barrier polymer such as a polyvinyl alcohol homopolymer or copolymer. However, polyvinyl alcohol has two drawbacks, (1) it adheres poorly to the preferred substrate layers unless the substrate is modified by a maleic anhydride grafted polypropylene homopolymer or copolymer as a tie layer, and (2) it lacks good adhesion to the subsequently applied metal layer such as aluminum. It has been determined, however, if a blend of polyvinyl alcohol homopolymer or copolymer and the ionomer is applied to the surface, a particularly aggressive bond is created. In addition, if this blend is applied after the substrate film has been machine direction oriented, then after the composite has been transverse direction oriented and a metal such as aluminum deposited on the surface, a uniquely ordered metal layer results.

In preparing the blend of the polyvinyl alcohol homopolymer or copolymer and the ionomer, the components ratio can range from 10:90 to 90:10 by dry weight. In preparing a roughly 50:50 blend in an aqueous dispersion for example 500 parts of a 10% solids aqueous solution of Vinol 325 or 50 parts by dry weight of Vinol 325 (a 98% hydrolyzed medium viscosity polyvinyl alcohol, obtained from Air Products) can be mixed with 156.3 parts by weight of a 32% solids aqueous dispersion of Petaflex 56220 or 50 parts by dry weight of Petaflex 56220 (an alkali salt of ethylene-methacrylic acid copolymer). This combination, adjusted to an aqueous 5% solids dispersion, will provide the polyvinyl alcohol to ionomer mixture in a ratio of approximately 50:50.

The following illustrate the invention.

EXAMPLE 1

An aqueous coating dispersion of 5% solids was placed in a gravure coater, which was located between the MD orienter and the TD of a film orienter. The coating was composed of 50 parts by dry weight of Vinol 325 (a 98% hydrolyzed, medium viscosity polyvinyl alcohol obtained from Air Products) and 50 parts by dry weight of Petaflex 56220 (an alkali salt of ethylene-methacrylic acid copolymer obtained from Whittaker Chemical Co). A polypropylene homopolymer (Exxon 4252) and an ethylene-propylene-butene-1 terpolymer skin resin containing 2000ppm of erucamide slip additive were coextruded at a weight ratio of 97-3 through a flat sheet die at 250° C., cast onto a cooling drum and quenched at 30° C. The coextruded sheet measuring about 30 mil thick, was reheated to 140° C. and stretched 5-fold MD, than corona treated on the homopolymer side for improved surface wettability. When passing through the gravure coater, the MD oriented film web, now about 6 mils thick, was coated on the homopolymer surface with the aqueous dispersion. The coated web was dried in pre-heat zones at 160° C., then stretched 8-fold in TD and annealed at 160° C. The biaxially stretched film measuring 0.8 mil, was corona treated on the coated side before it was wound into a film roll. The resultant coated film had a coating weight of 0.20 mg/sq. in and good clarity.

COMPARATIVE EXAMPLE A

A control film sample was prepared in a manner similar to Example 1 except that the aqueous coating was omitted. The homopolymer surface was treated with corona discharge to give a surface tension of 38 dynes/cm. The uncoated film had a percent haze of 1.5 and a gloss of 88.4.

The above examples were vacuum-deposited with aluminum in a conventional manner. These films were compared with each other in terms of (1) metal adhesion to the film surface and (2) barrier properties. The adhesion was evaluated by peeling off the coating using 610 Scotch tape. The barrier properties were characterized by oxygen transmission rate (OTR) and water vapor transmission (WVTR), using Ox-tran 1050 A and Permatran-W, respectively. Both of these instruments were manufactured by Modern Controls, Inc. These results are shown in Table 1.

TABLE 1

| Example | Primer Composition | Metallized Film | | |
|---|---|---|---|---|
| | | Adhesion (1) | OTR (2) | WVTR (3) |
| 1 | 50/50 PVOH/Ionomer | 10 | 1.8 | 0.06 |
| A | None | 8 | 15 | 0.11 |

(1) 10 = best (0% coating peel-off). 0 = worst (100% coating peel-off).
(2) Oxygen transmission rate. measured in cc/100 sq.in./24 hr. at 0% RH and 86° F.
(3) Water vapor transmission rate. measured in gm/100 sq.in./24 hr. at 100% RH and 100° F.

Although the present invention has been described with reference to preferred embodiments, it is to be understood that modifications and variations may be resorted to without departing from the spirit and scope of this invention. Such modifications and variation are considered to be within the perview and scope of the appended claims.

What is claimed is:

1. A metallized film combination comprising an oriented polymer substrate layer susceptible in unmodified form of transmitting oxygen and moisture, at least one surface of which having a layer of a blend of (a) a vinyl alcohol homopolymer or copolymer and (b) an ionic copolymer of ethylene and an ethylenically unsaturated monocarboxylic acid wherein at least 10% of the carboxylic acid groups are neutralized with an alkali metal ion; and the surface of said layer blend having a metal layer thereon.

2. The film combination of claim 1 wherein the polymer substrate is a propylene homopolymer or copolymer thereof.

3. The film combination of claim 1 wherein the ratio of (a) to (b) is from about 10:90 to 90:10.

4. The film combination of claim 3 wherein said blend is a blend of (a) a member selected from the group consisting of polyvinyl alcohol and ethylene-vinyl alcohol copolymer and (b) an alkali metal salt of ethylene-acrylic acid copolymer or ethylene-methacrylic acid copolymer.

5. The film combination of claim 4 wherein said blend comprises (a) polyvinyl alcohol and (b) an alkali metal salt of ethylene acrylic acid copolymer.

6. The film combination of claim 4 wherein said blend comprises (a) polyvinyl alcohol and (b) an alkali metal salt of ethylene-methacrylic acid copolymer.

7. The film combination of claim 4 wherein the other side of said polypropylene substrate is modified by a maleic anhydride grafted polypropylene homopolymer or copolymer.

8. The film combination of claim 4 wherein one side of said substrate carries a heat-seal layer.

9. The film combination of claim 8 wherein said heat-seal layer is a copolymer of ethylene and propylene or a terpolymer of ethylene, propylene and butene-1.

10. A method of forming a metallized film combination comprising: (a) providing a polymeric substrate layer susceptible in its unmodified form of transmitting oxygen and moisture; (b) machine direction orienting said film; (c) coating at least one side of said substrate layer with a blend of (1) a vinyl alcohol homopolymer or copolymer and (2) an ionic copolymer of ethylene and an ethylenically unsaturated monocarboxylic acid wherein at least 10% of the carboxylic acid groups are neutralized with a metal ion; (d) transverse direction orienting said film; and (e) depositing a metal layer on the surface of said blend.

11. The method of claim 7 wherein said metal ion is sodium or zinc and said metal layer is aluminum.

* * * * *